(12) United States Patent
Harada

(10) Patent No.: US 9,887,105 B2
(45) Date of Patent: Feb. 6, 2018

(54) MANUFACTURING METHOD OF SEMICONDUCTOR DEVICE

(71) Applicant: RENESAS ELECTRONICS CORPORATION, Tokyo (JP)

(72) Inventor: Haruhiko Harada, Takasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 99 days.

(21) Appl. No.: 14/983,143

(22) Filed: Dec. 29, 2015

(65) Prior Publication Data
US 2016/0211152 A1 Jul. 21, 2016

(30) Foreign Application Priority Data
Jan. 21, 2015 (JP) .................... 2015-009253

(51) Int. Cl.
*H01L 21/56* (2006.01)
*B29C 45/14* (2006.01)
(Continued)

(52) U.S. Cl.
CPC ............ *H01L 21/565* (2013.01); *B29C 45/02* (2013.01); *B29C 45/14655* (2013.01); *B29C 45/4005* (2013.01); *H01L 21/561* (2013.01); *H01L 24/97* (2013.01); *B29K 2105/255* (2013.01); *H01L 23/295* (2013.01); *H01L 23/3128* (2013.01); *H01L 24/32* (2013.01); *H01L 24/45* (2013.01); *H01L 24/48* (2013.01); *H01L 24/73* (2013.01); *H01L 24/85* (2013.01); *H01L 24/92* (2013.01); *H01L 2224/04042* (2013.01); *H01L 2224/32225* (2013.01); *H01L 2224/32245* (2013.01); *H01L 2224/45144* (2013.01); *H01L 2224/48091* (2013.01); *H01L 2224/48227* (2013.01); *H01L 2224/48228* (2013.01);
(Continued)

(58) Field of Classification Search
CPC combination set(s) only.
See application file for complete search history.

(56) References Cited

U.S. PATENT DOCUMENTS

2011/0233821 A1* 9/2011 Bandoh .................. B29C 43/18
                                                     264/272.11
2013/0028998 A1* 1/2013 Maekawa ............. H01L 21/565
                                                     425/129.1

FOREIGN PATENT DOCUMENTS

JP    2002-343819 A    11/2002
JP    2006-049697 A    2/2006

* cited by examiner

*Primary Examiner* — Kyoung Lee
*Assistant Examiner* — Ratisha Mehta
(74) *Attorney, Agent, or Firm* — McDermott Will & Emery LLP

(57) ABSTRACT

An object of the present invention is to improve the reliability and productivity of a semiconductor device by suppressing generation of a resin burr in a molding process. In a mold die, a tip-end surface of each push-up pin provided on the rear surface side of a lower die cavity block and a part of the rear surface of the lower die cavity block with which the tip-end surface of each push-up pin is contacted are inclined in such a manner that a distance to a top surface of the lower die cavity block becomes longer towards the pot side where mold resin is supplied. Accordingly, when the lower die cavity block is returned to the initial position, the lower die cavity block is lifted while being slightly moved towards the pot block side. Thus, no gap is formed between a side surface of the pot block and a side surface of the lower die cavity block.

7 Claims, 18 Drawing Sheets

(51) Int. Cl.
  *B29C 45/40*  (2006.01)
  *B29C 45/02*  (2006.01)
  *H01L 23/29*  (2006.01)
  *H01L 23/31*  (2006.01)
  *H01L 23/00*  (2006.01)
  *B29K 105/00*  (2006.01)

(52) U.S. Cl.
  CPC ............... *H01L 2224/48247* (2013.01); *H01L 2224/48465* (2013.01); *H01L 2224/73265* (2013.01); *H01L 2224/85203* (2013.01); *H01L 2224/85205* (2013.01); *H01L 2224/92247* (2013.01); *H01L 2224/97* (2013.01); *H01L 2924/15184* (2013.01); *H01L 2924/15311* (2013.01); *H01L 2924/181* (2013.01)

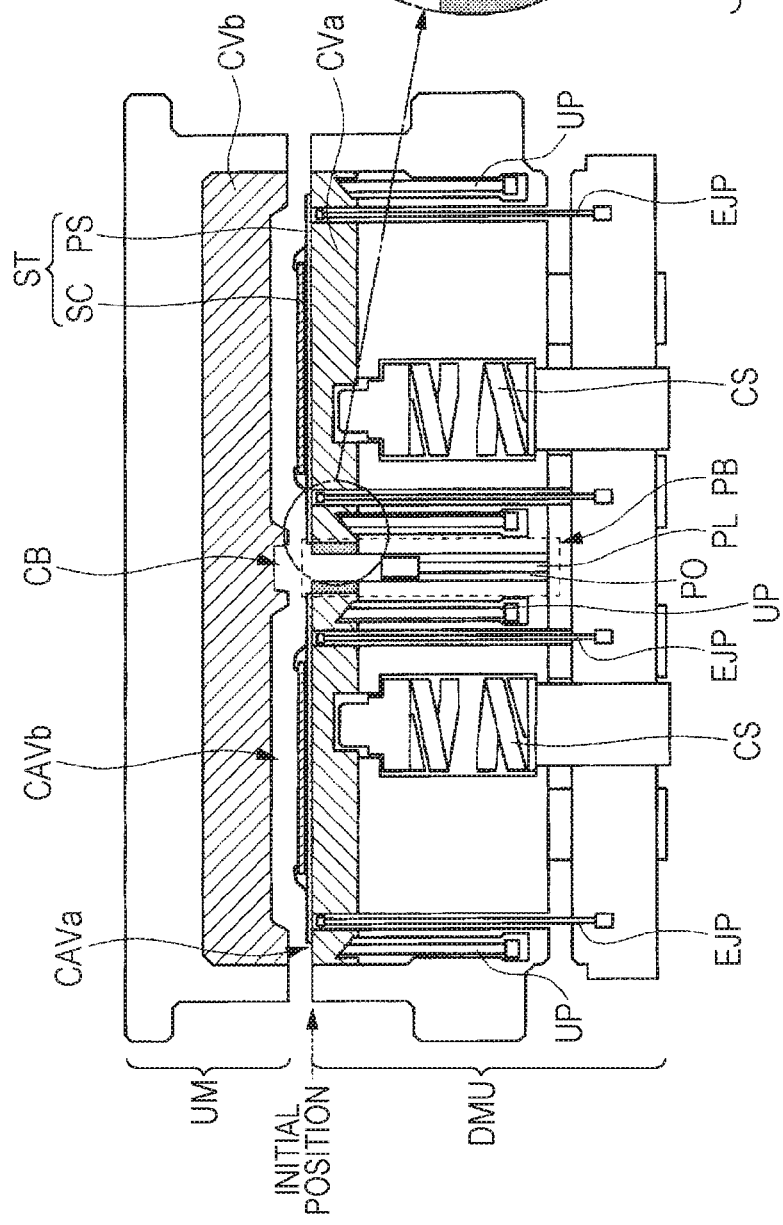
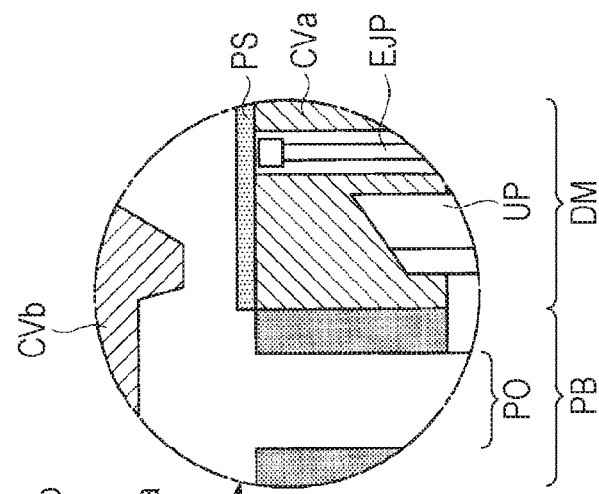
FIG. 5A
FIG. 5B

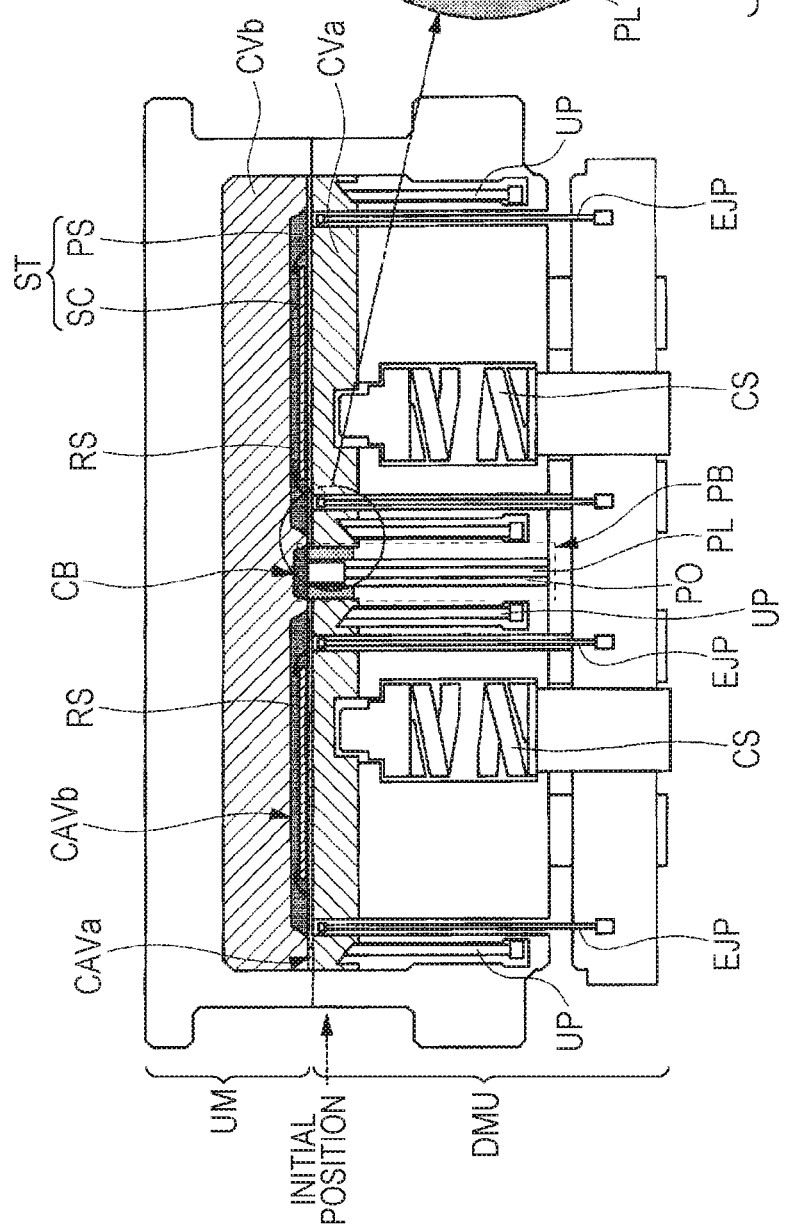
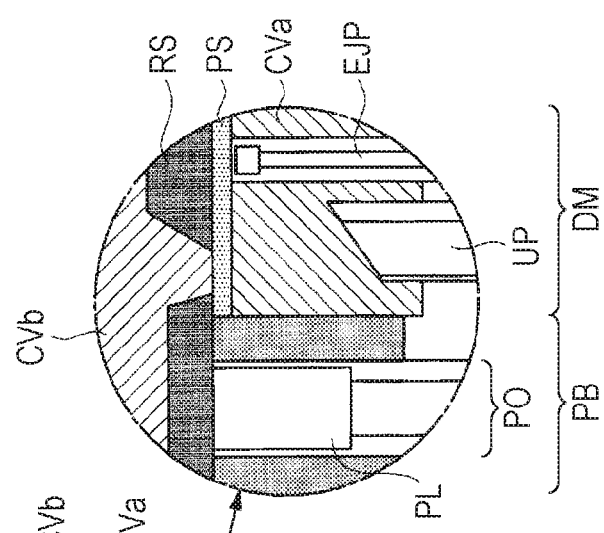
FIG. 10A
FIG. 10B

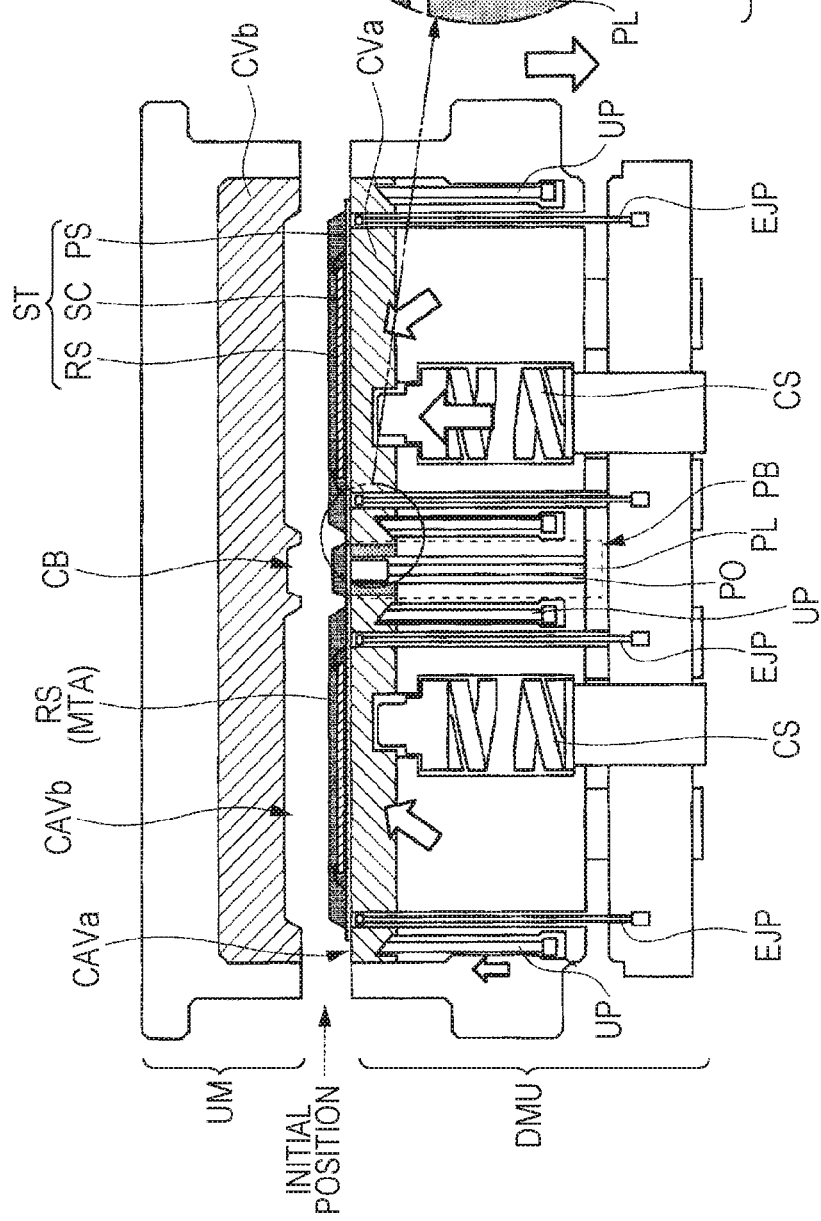
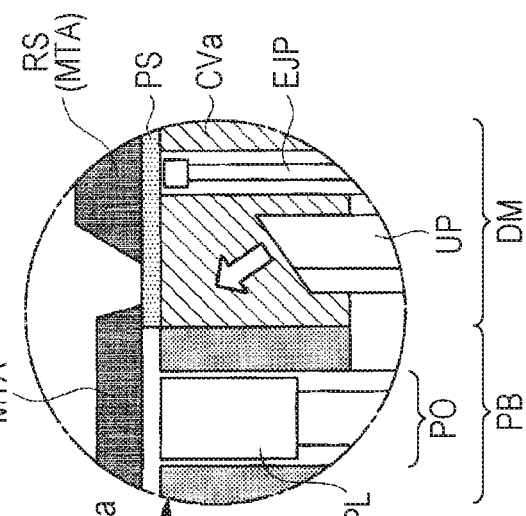
FIG. 12A
FIG. 12B

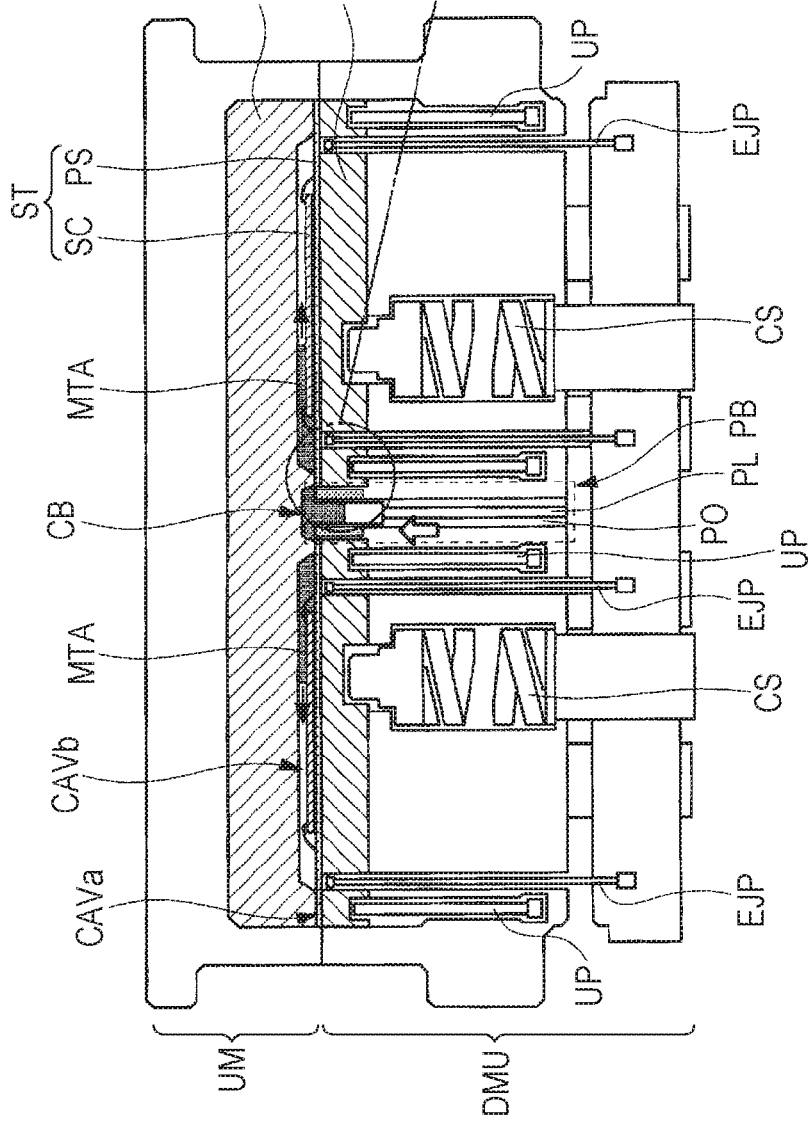
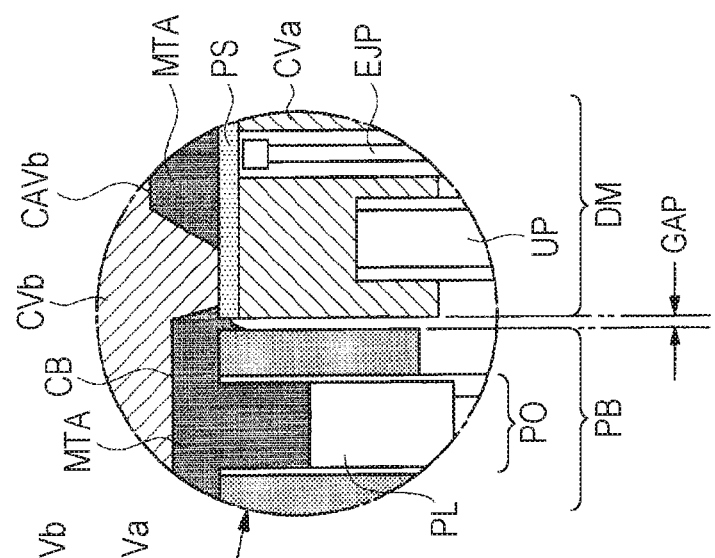
FIG. 16A
FIG. 16B

MANUFACTURING METHOD OF SEMICONDUCTOR DEVICE

CROSS-REFERENCE TO RELATED APPLICATIONS

The disclosure of Japanese Patent Application No. 2015-009253 filed on Jan. 21, 2015 including the specification, drawings and abstract is incorporated herein by reference in its entirety.

BACKGROUND

The present invention relates to a manufacturing technique of a semiconductor device, and can be preferably used for, for example, manufacturing of a semiconductor device in which semiconductor chips are sealed with resin by a transfer molding method.

For example, Japanese Unexamined Patent Application Publication No. 2006-049697 describes a technique in which a molding die having an upper die and a lower die is separated into the upper die and the lower die by injecting resin into a cavity, and a substrate mounting table is moved upward using pins, so that the height position of the substrate mounting table relative to a base member is returned to the initial position.

Further, Japanese Unexamined Patent Application Publication No. 2002-343819 describes a technique in which when sealing with resin, the resin pressure of melted resin is applied to a movable taper member that is a rigid member so as to prevent a gap from being generated between an upper die and a substrate. Accordingly, a resin burr is suppressed, and the substrate is clamped by an appropriate clamping pressure through a compression spring.

SUMMARY

When mold resin adheres to a side surface of a package substrate on which semiconductor chips are mounted in a molding process in which the semiconductor chips are sealed with resin, the mold resin becomes a resin burr and scatters, resulting in causing foreign substances. The inventors studied and found that the reliability and productivity of the semiconductor device are deteriorated due to the foreign substances.

The other objects and novel features will become apparent from the description of the specification and the accompanying drawings.

According to an embodiment, in a mold die including an upper die, a lower die, and a pot block, a tip-end surface of each push-up pin provided on the rear surface side of a lower die cavity block and a part of the rear surface of the lower die cavity block with which the tip-end surface of each push-up pin is contacted are inclined in such a manner that a distance to a top surface of the lower die cavity block becomes longer towards the pot side where mold resin is supplied.

According to an embodiment, the reliability and productivity of a semiconductor device can be improved by suppressing generation of a resin burr in a molding process.

BRIEF DESCRIPTION OF THE DRAWINGS

FIGS. 5A and 5B are a main part cross-sectional view for explaining a state of the molding device in the molding process according to the embodiment and a main part cross-sectional view for showing the lower die unit of the molding device while enlarging a part thereof, respectively;

FIGS. 10A and 10B are a main part cross-sectional view for explaining a state of the molding device in the molding process and a main part cross-sectional view for showing the lower die unit of the molding device while enlarging a part thereof, respectively, continued from FIG. 8 and FIG. 9;

FIGS. 12A and 12B are a main part cross-sectional view for explaining a state of the molding device in the molding process and a main part cross-sectional view for showing the lower die unit of the molding device while enlarging a part thereof, respectively, continued from FIG. 10 and FIG. 11;

FIGS. 16A and 16B are a main part cross-sectional view for showing an example of a molding device compared and studied by the inventors and a main part cross-sectional view for showing a lower die unit of the molding device while enlarging a part thereof, respectively;

DETAILED DESCRIPTION

Figure 1:
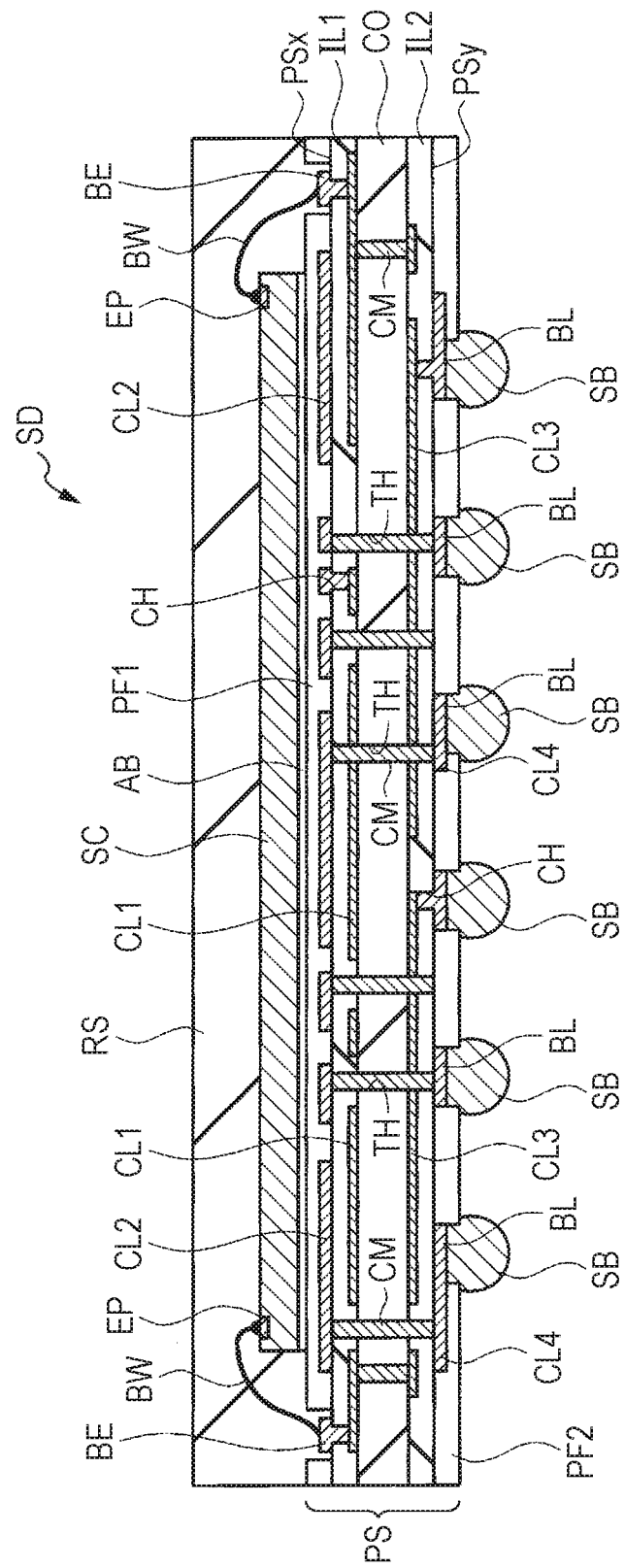
FIG. 1 is a main part cross-sectional view for showing a semiconductor device (BGA package) according to an embodiment.

The present invention will be described using the following embodiment while being divided into a plurality of sections or embodiments if necessary for convenience sake. However, except for a case especially specified, the sections or embodiments are not irrelevant to each other, and one has a relationship with a part of a modified example or a complete modified example, or a detailed or supplementary explanation of the other.

Further, if the specification refers to the number of elements (including the number of pieces, values, amounts, ranges, and the like) in the following embodiment, the present invention is not limited to the specific number, but may be smaller or larger than the specific number, except for a case especially specified or a case obviously limited to the specific number in principle.

Furthermore, it is obvious that the constitutional elements (including elemental steps and the like) are not necessarily essential in the following embodiment, except for a case especially specified or a case obviously deemed to be essential in principle.

Further, it is obvious that the expressions of "comprised of A", "composed of A", "have A", and "include A" do not exclude elements other than "A" except for a case especially specified that the element is limited to only "A". As similar to the above, if the specification refers to the shapes or positional relationships of constitutional elements in the following embodiment, the present invention includes those that are substantially close or similar to the constitutional elements in shapes and the like, except for a case especially specified or a case obviously deemed not to be close or similar in principle. The same applies to the values and ranges.

Further, hatched lines are used in some drawings used in the following embodiment in order to easily view the drawings even in the case of plan views. Further, constitutional elements having the same functions are given the same reference numerals in principle in the all drawings for explaining the following embodiment, and the repeated explanation thereof will be omitted. Hereinafter, the embodiment will be described in detail on the basis of the drawings.

(Detailed Description of Problem in Molding Process)

A problem, found by the inventors, in a molding process for sealing a semiconductor chip with resin will be described in detail because a manufacturing method of a semiconductor device according to an embodiment becomes possibly clearer.

For example, in manufacturing of a substrate such as a BGA (Ball Grid Array) package, there is a molding process in which a semiconductor chip is sealed with resin using a mold die (an upper die, a lower die, and a pot block).

FIGS. 16A and 16B are a main part cross-sectional view for showing an example of a molding device compared and studied by the inventors and a main part cross-sectional view for showing a lower die unit of the molding device while enlarging a part thereof, respectively.

The mold die is configured in such a manner that in order to absorb variations in the thickness of a substrate ST (specifically, a package substrate (a substrate and a wiring substrate) PS on which a semiconductor chip SC is mounted) mounted on a surface of a lower die cavity CAVa of a lower die cavity block CVa, the lower die cavity block CVa can be slidably moved (can be moved up and down). Further, push-up pins UP are provided on the rear surface side of the lower die cavity block CVa, so that the lower die cavity block CVa is returned to the initial position in order to perform the next molding process after the preceding molding process is finished.

Incidentally, in order to slidably move the lower die cavity block CVa, a gap of, for example, about 5 to 10 μm is provided between a side surface of the lower die cavity block CVa and a side surface of a pot block PB that supplies a mold resin MTA. As a result, a part of the mold resin MTA supplied from the pot block PB into an upper die cavity CAVb enters the gap at a part corresponding to a flow path (for example, a runner RA shown in FIG. 11) of the mold resin MTA.

Figure 17A:
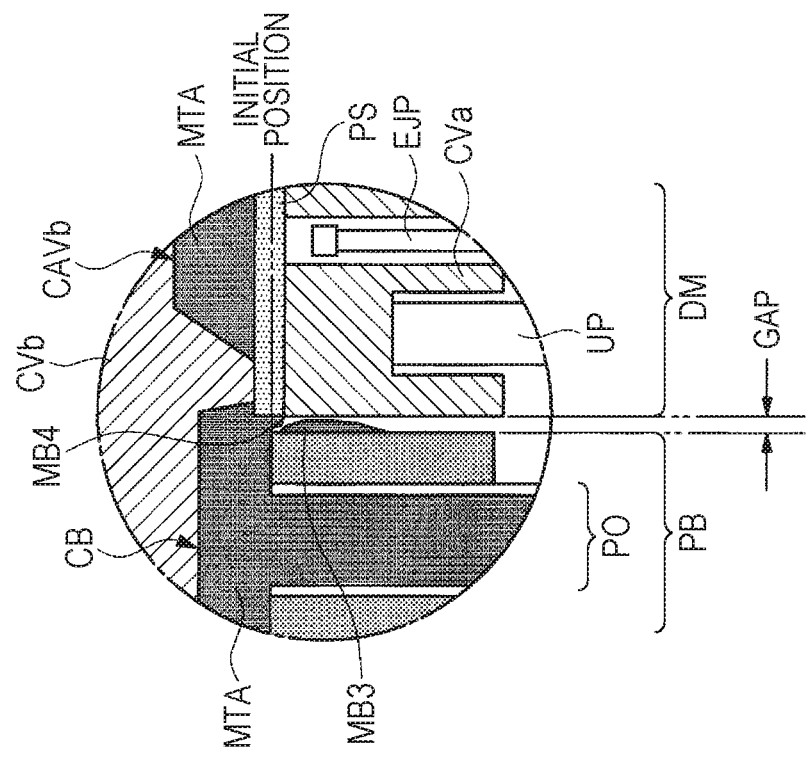
FIG. 17A is a main part cross-sectional view for explaining a resin burr adhering to a side surface of a package substrate and for showing the lower die unit while enlarging a part thereof.

As shown in, for example, FIG. 17A, when the mold resin MTA having entered the gap is gradually accumulated to become a resin burr MB1, the slide of the lower die cavity block CVa is inhibited and the lower die cavity block CVa cannot be returned to the initial position. If the next molding process is performed in a state where the lower die cavity block CVa is not completely returned to the initial position, a part (a resin burr MB2) of the mold resin MTA adheres to a side surface of the package substrate PS, and the resin burr MB2 separated from the side surface of the package substrate PS causes foreign substances later.

Figure 17B:
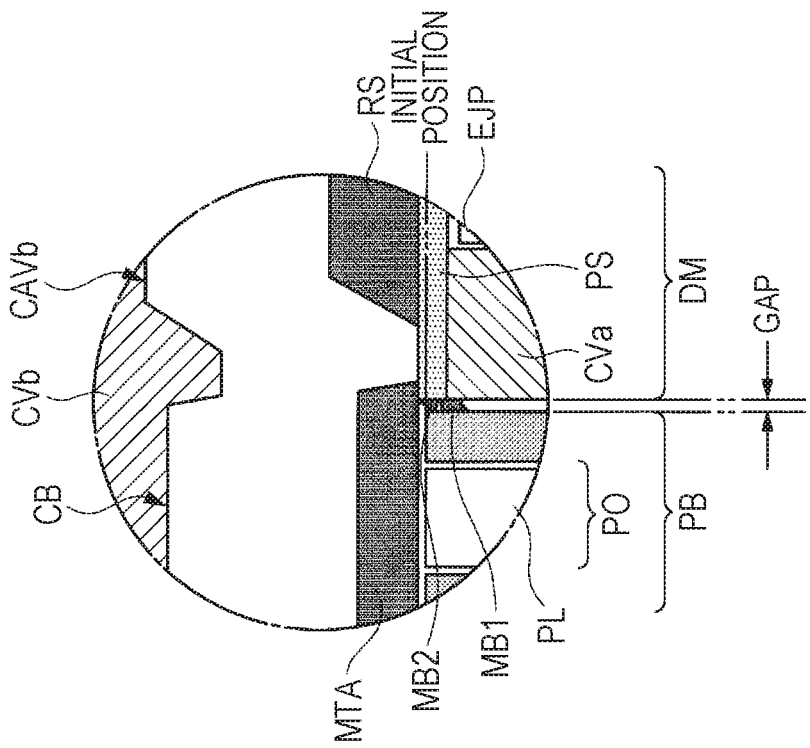
FIG. 17B is a main part cross-sectional view for explaining another example of the resin burr adhering to the side surface of the package substrate and for showing the lower die unit while enlarging a part thereof.

Further, as shown in, for example, FIG. 17B, even when a part (a resin burr MB3) of the mold resin MTA adheres to a side surface of the pot block PB, the resin burr MB3 adhering to the side surface of the pot block PB inhibits the slide of the lower die cavity block CVa, and the lower die cavity block CVa cannot be returned to the initial position as similar to the resin burr MB1. If the next molding process is performed in a state where the lower die cavity block CVa is not completely returned to the initial position, a part (a resin burr MB4) of the mold resin MTA adheres to a side surface of the package substrate PS, and the resin burr MB4 separated from the side surface of the package substrate PS causes foreign substances later.

Figure 18:
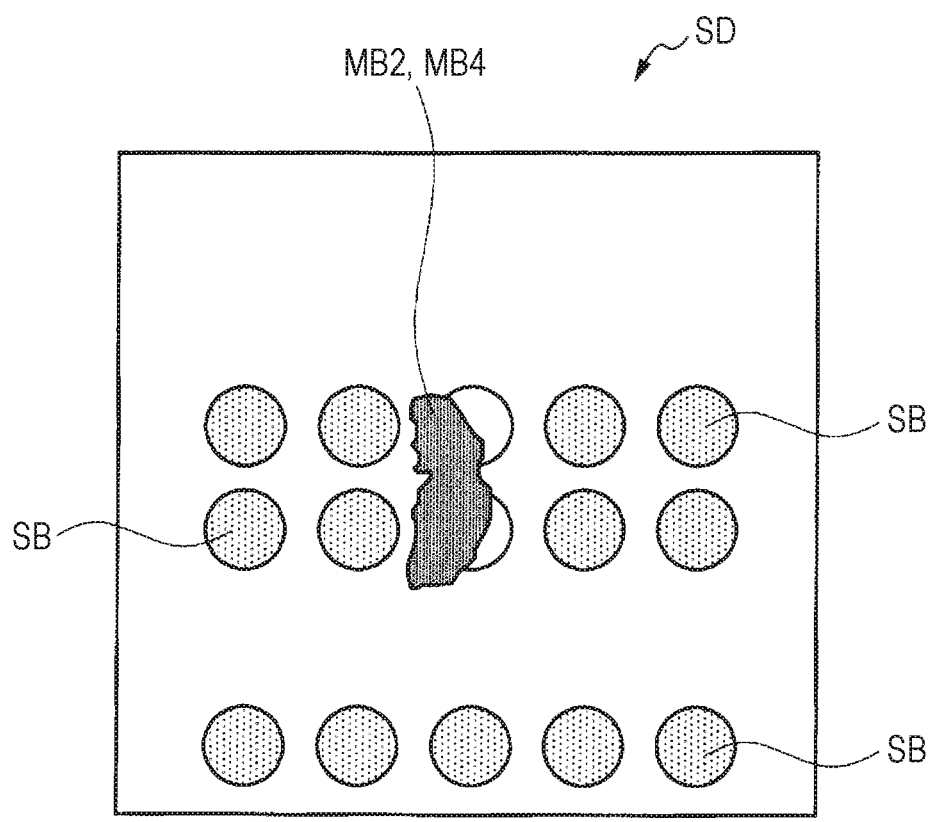
FIG. 18 is a diagram of a rear surface for explaining resin burrs adhering to a joint part of external terminals of the semiconductor device (BGA package).

In addition, as shown in, for example, FIG. 18, when the resin burrs MB2 and MB4 causing foreign substances scatter to adhere to a joint part (land surface) between solder balls (external terminals) SB of a semiconductor device (BGA package) SD, the solder balls SB cannot be coupled, and a defective product is manufactured. Thus, the reliability and productivity of the semiconductor device SD are deteriorated.

Therefore, it is necessary to prevent the mold resin MTA from entering the gap between the side surface of the lower die cavity block CVa and the side surface of the pot block PB.

Embodiment

1. Structure of Semiconductor Device

A semiconductor device according to the embodiment is a resin sealing-type semiconductor package in which a semiconductor chip is mounted on a package substrate. Hereinafter, a structure of a BGA package will be described using FIG. 1 as an example of the semiconductor device according to the embodiment. FIG. 1 is a main part cross-sectional view for showing a semiconductor device (BGA package).

As shown in FIG. 1, the package structure of the semiconductor device (BGA package) SD according to the embodiment includes a package substrate (a substrate and a wiring substrate) PS having an upper surface (top surface) PSx and a lower surface (rear surface) PSy opposite to the upper surface PSx. Further, a semiconductor chip SC in which a semiconductor element is formed and a resin sealing body (sealing body) RS sealing the semiconductor chip SC are provided on the upper surface PSx side of the package substrate PS. Further, a plurality of bump lands (electrode pads) BL and a plurality of solder balls (external terminals) SB coupled to the bump lands BL are provided on the lower surface PSy side of the package substrate PS. Hereinafter, the package substrate PS, the semiconductor chip SC, and the solder balls SB will be described in detail.

<<Package Substrate PS>>

The plane of the package substrate PS intersecting with the thickness direction thereof is formed in a quadrangular shape. The package substrate PS has a multi-layer wiring structure, and includes four wiring layers in the embodiment. The thickness of the package substrate PS is, for example, about 0.2 to 0.6 mm.

In more detail, the package substrate PS includes a core material CO, a wiring layer CL1 formed on a surface (the upper surface PSx side) of the core material CO, an insulating layer IL1 formed to cover the wiring layer CL1, and a wiring layer CL2 formed on a surface of the insulating layer IL1. In this case, a plurality of bonding electrodes BE is configured using a part of the uppermost wiring layer CL2, and is exposed from a protective film PF1 formed to cover the uppermost wiring layer CL2.

Further, the package substrate PS includes a wiring layer CL3 formed on the rear surface (the side of the lower surface PS) located opposite to the surface of the core material CO, an insulating layer IL2 formed to cover the wiring layer CL3, and a wiring layer CL4 formed on a surface of the insulating layer IL2. In this case, the bump lands BL are configured using a part of the lowermost wiring layer CL4, and are exposed from a protective film PF2 formed to cover the lower most wiring layer CL4.

Further, a plurality of through-holes (vias) TH is formed from the upper surface PSx of the package substrate PS towards the lower surface PSy or from the surface of the core material CO towards the rear surface. Conductive members CM that electrically couple the wiring layers CL1, CL2, CL3, and CL4 to each other are formed inside (inner walls) the respective through-holes TH. Further, the wiring layer CL1 is electrically coupled to the wiring layer CL2 through a plurality of coupling holes CH formed in the insulating layers IL1 and IL2, and the wiring layer CL3 is electrically coupled to the wiring layer CL4.

The core material CO and the respective insulating layers IL1 and IL2 are formed of, for example, high-elasticity resin obtained by impregnating epoxy or polyimide thermosetting insulating resin into glass fibers. Further, the respective wiring layers CL1, CL2, CL3, and CL4 are formed of, for example, copper-based metal films.

The protective film PF1 covering the upper surface PSx side of the package substrate PS is formed to mainly protect the uppermost wiring layer CL2 of the package substrate PS, and the protective film PF2 covering the lower surface PSy side of the package substrate PS is formed to mainly protect the lowermost wiring layer CL4 of the package substrate PS. The protective films PF1 and PF2 are configured using, for example, a solder resist comprised mainly of epoxy or polyimide thermosetting insulating resin.

<<Semiconductor Chip SC>>

The plane of the semiconductor chip SC intersecting with the thickness direction thereof is formed in a quadrangular shape. For example, the semiconductor chip SC includes a semiconductor substrate made of silicon, a plurality of semiconductor elements formed on the principal surface (top surface) of the semiconductor substrate, multiple wiring layers obtained by laminating insulating layers and wiring layers, and a surface protective film formed to cover the multiple wiring layers.

The semiconductor chip SC is mounted on the upper surface PSx side of the package substrate PS through a die bond material (adhesive) AB while the rear surface opposite to the principal surface (top surface) of the semiconductor chip SC is allowed to face the protective film PF1. The die bond material AB used in the embodiment is, for example, paste-like or film-like adhesive.

On the principal surface of the semiconductor chip SC, a plurality of electrode pads EP electrically coupled to the semiconductor elements is arranged along the respective sides of the semiconductor chip SC. These electrode pads EP are configured using wirings of the uppermost layer among the multiple wiring layers, and are exposed from opening parts formed in the surface protective film of the semiconductor chip SC while being associated with the electrode pads EP.

Further, the electrode pads EP are electrically coupled to the bonding electrodes BE arranged on the upper surface PSx of the package substrate PS through a plurality of conductive members (bonding wires) BW. For example, gold wires are used for the conductive members BW. The conductive members BW are coupled to the electrode pads EP arranged on the principal surface of the semiconductor chip SC and the bonding electrodes BE arranged on the upper surface PSx of the package substrate PS by, for example, a nail head bonding (ball bonding) method in which ultrasonic vibrations are used together with thermocompression.

The semiconductor chip SC and the conductive members BW are sealed with a resin sealing body RS covering the upper surface PSx side of the package substrate PS. In order to realize low stress, the resin sealing body RS is formed of epoxy thermosetting insulating resin with, for example, a phenol-based curing agent, silicone rubber, and a plurality of fillers (for example, silica) added. The resin sealing body RS is formed by a transfer molding method to be described later.

<<Solder Ball SB>>

The solder balls SB are joined to the bump lands BL formed on the lower surface PSy of the package substrate PS. The bump lands BL are exposed from opening parts formed in the protective film PF2 covering the lower surface PSy side of the package substrate PS while being associated with the bump lands BL, and the solder balls SB and the bump lands BL are electrically and mechanically coupled to each other. Solder bumps having a lead-free solder composition that substantially contains no lead, for example, an Sn-3 [wt %] Ag-0.5 [wt %] Cu composition are used for the solder balls SB.

2. Structure of Molding Device (Mold Device)

A structure of a molding device (mold device) according to the embodiment will be described using FIGS. 2A and 2B and FIG. 3. FIGS. 2A and 2B are a main part cross-sectional view for showing an example of the molding device and a main part cross-sectional view for showing a lower die unit of the molding device while enlarging apart thereof, respectively. FIG. 3 is a main part top view for showing the lower die unit on which a lower die cavity block is mounted.

As shown in FIGS. 2A and 2B, the molding device according to the embodiment is a semiconductor manufacturing device for transfer molding. The mold die of the molding device includes a lower die DM (first die) in which a package substrate having a semiconductor chip mounted is arranged and an upper die UM (second die) that faces the lower die DM and is engaged with the lower die DM to seal the package substrate having the semiconductor chip mounted. Further, the mold die of the molding device includes a pot block PB that supplies mold resin. In the following description, the lower die DM and the pot block PB are collectively referred to as a lower die unit DMU. In FIG. 2A, an area surrounded by the dotted line in the lower die unit DMU corresponds to the pot block PB, and the other areas correspond to the lower die DM.

The upper die UM is configured to be associated with the lower die DM. The upper die UM includes an upper die cavity CAVb (cavity part) serving as a package area that seals the semiconductor chip with resin, a gate GA (not shown in FIGS. 2A and 2B, but see FIG. 11) serving as an inlet when the mold resin flows into the upper die cavity CAVb, and an upper die cavity block CVb which is communicated with the upper die cavity CAVb through the gate GA and in which a runner (see FIG. 11) serving as an inflow route of the mold resin is formed. Further, a cull block CB that serves as an inflow source of the mold resin and that is communicated with the runner RA formed in the upper die UM when the upper die UM and the lower die DM are closed is formed at the upper die cavity block CVb.

The lower die DM configuring the lower die unit DMU includes a lower die cavity block CVa, at an area other than the pot block PB, at which a lower die cavity CAVa serving as a package area that seals the semiconductor chip with resin is formed. In the embodiment, the lower die cavity blocks CVa are arranged on the both sides of the pot block PB (see FIG. 3 to be described later). The package substrate on which the semiconductor chip is mounted is arranged on the top surface (the molding surface or the principal surface) of the lower die cavity CAVa. It should be noted that the surface of the lower die cavity CAVa and the surface of the lower die cavity block CVa are in the same plane in the embodiment. Thus, when referring to the surface of the lower die cavity block CVa, the surface of the lower die cavity CAVa is included.

Further, the lower die DM is provided with a plurality of ejector pins EJP to push up the substrate sealing the semiconductor chip with resin from the lower die cavity block CVa. Further, the lower die DM is provided with a plurality of push-up pins UP that can return the lower die cavity block CVa to the initial position by pushing up the lower die cavity block CVa after the molding process and a plurality of compression springs CS that can move up and down the lower die cavity block CVa in accordance with a clamping pressure.

For example, the ejector pins EJP are provided in such a manner that each end thereof protrudes from the surface of the lower die cavity block CVa by about 30 to 50 μm.

Further, a tip-end surface (a surface pushing up the lower die cavity block CVa, or a push-up surface) of each push-up pin UP is inclined in such a manner that a distance between the tip-end surface and the surface (the surface of the lower die cavity CAVa on which the package substrate is mounted) of the lower die cavity block CVa becomes longer towards the pot block PB side. In other words, a length (H1) between the tip-end surface of each push-up pin UP on the side (the pot PO side) where resin is injected into the upper die cavity CAVb and the surface (the surface of the lower die cavity CAVa on which the package substrate is mounted) of the lower die cavity block CVa is longer in a cross-sectional view than a length (H2) between the tip-end surface of each push-up pin UP on the center side of the upper die cavity CAVb and the surface (the surface of the lower die cavity CAVa on which the package substrate is mounted) of the lower die cavity block CVa. Further, the tip-end surface of each push-up pin UP is inclined in such a manner that a distance between the tip-end surface and the surface (the surface of the lower die cavity CAVa on which the package substrate is mounted) of the lower die cavity block CVa becomes shorter towards the direction of the flow of resin in a cross-sectional view. Further, a part of the rear surface opposite to the top surface of the lower die cavity CAVa with which the tip-end surface of each push-up pin UP is contacted is inclined in such a manner that a distance to the surface (the surface of the lower die cavity CAVa on which the package substrate is mounted) of the lower die cavity block CVa becomes longer towards the pot block PB side after the tip-end surface of each push-up pin UP as similar to the above.

Further, the tip-end surface of each push-up pin UP is mirror-finished, and the roughness of the surface is, for example, 3 μm or smaller in ten-point average roughness (Rz). The push-up pins UP can be smoothly moved by mirror finishing. Further, hard chromium plating is applied to the tip-end surface of each push-up pin UP. A plating film is formed on the tip-end surface of each push-up pin UP, so that the tip-end surface of each push-up pin UP is hardly worn, and each push-up pin UP can be smoothly moved. The thickness of the plating film is, for example, about 1 μm.

A pot PO into which a tablet (obtained by solidifying the mold resin with a pressure) is put is formed at the pot block PB configuring the lower die unit DMU. A plunger PL that moves up and down is provided in the pot PO. The tablet put into the pot PO is pressurized and melted by lifting the plunger PL using a servomotor. The fluidized mold resin obtained by melting the tablet is injected into the upper die cavity CAVb through the cull block CB, the runner RA, and the gate GA.

As shown in FIG. 3, for example, the lower die cavity blocks CVa are arranged on the both sides (a second direction orthogonal to a first direction on the surface of the lower die cavity block CVa) of the pot block PB having the pots PO in the first direction. In addition, the package substrate on which the semiconductor chips are mounted is placed in an area of each lower die cavity block CVa where the substrate is mounted, namely, in the lower die cavity CAVa.

It should be noted that the structure of the mold die (the upper die UM and the lower die unit DMU (the lower die DM and the pot block PB)) is not limited to that described using FIGS. 2A and 2B and FIG. 3. The cull block and the runner are formed at the upper die UM in the embodiment. However, for example, the cull block may be formed at the upper die UM, and the runner may be formed at the lower die DM. Alternatively, the cull block and the runner may be formed at the lower die DM.

3. Manufacturing Method of Semiconductor Device

Figure 4:
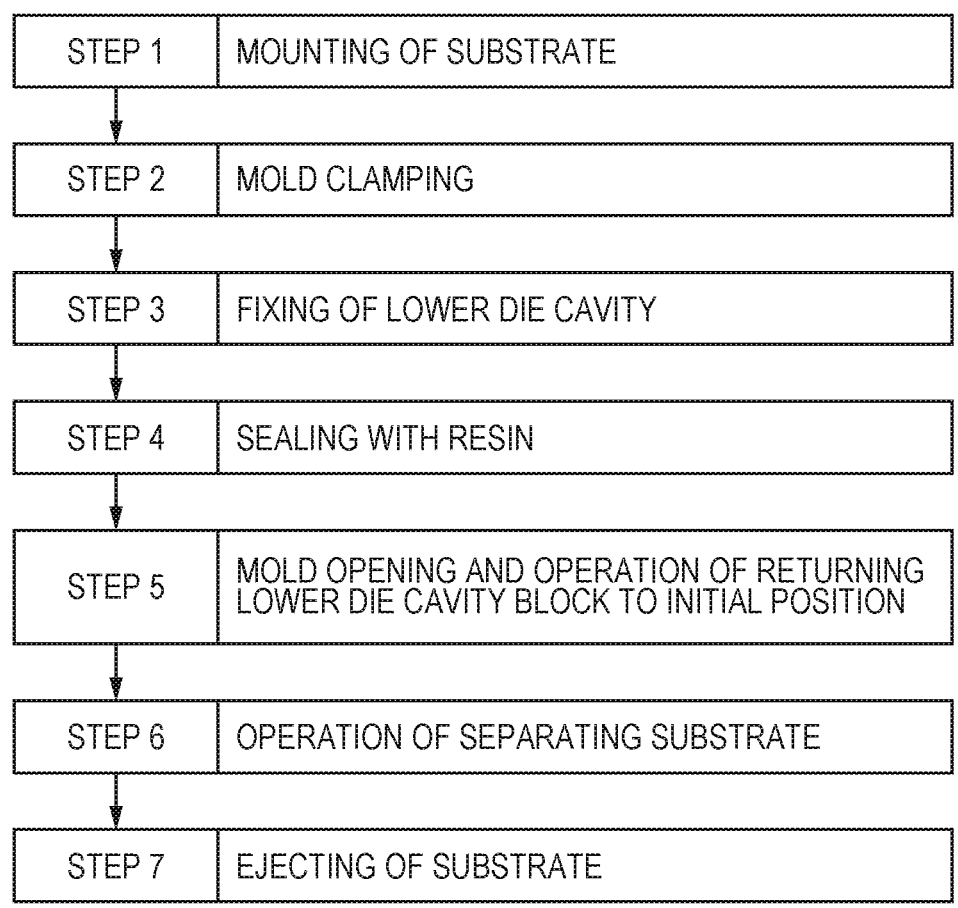
FIG. 4 is a flowchart in a molding process of a manufacturing method of a semiconductor device according to the embodiment.
Figure 6:
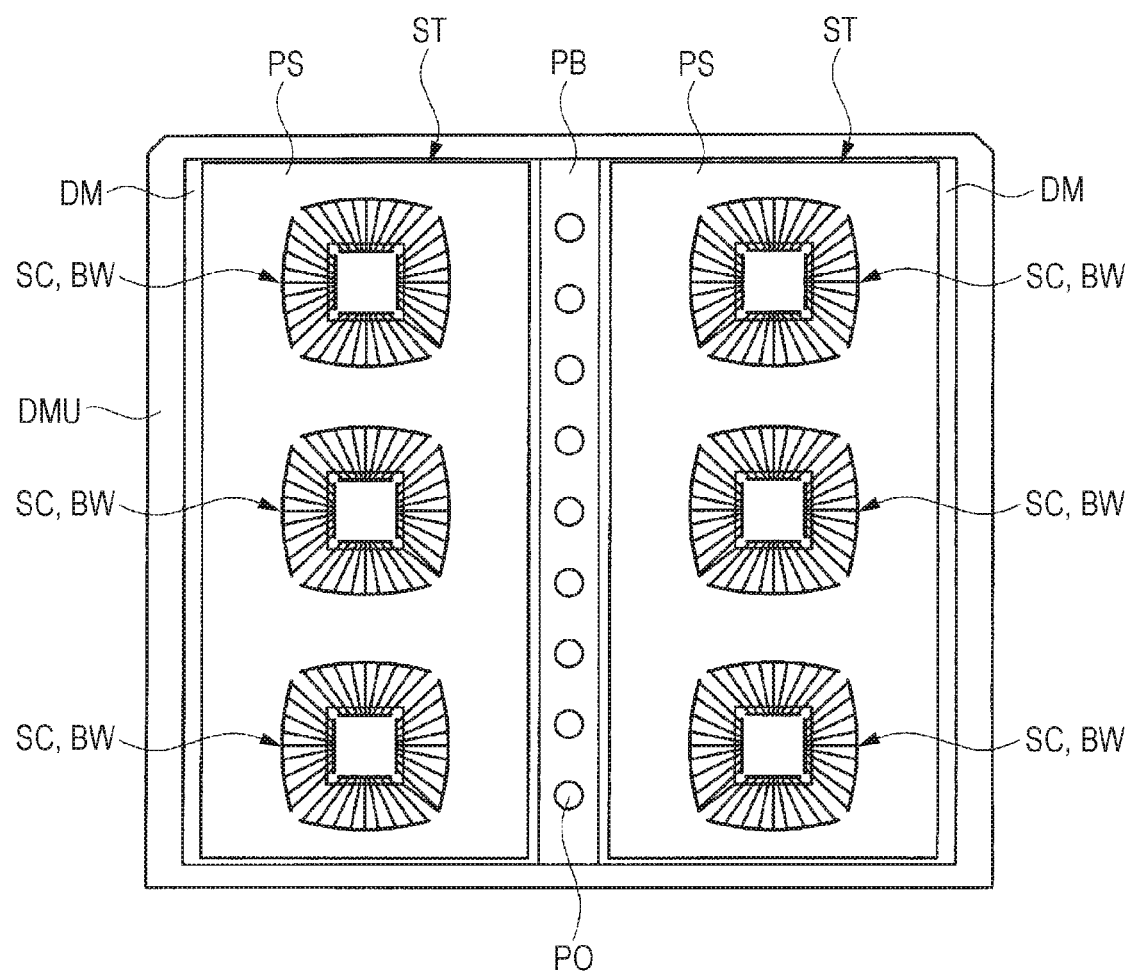
FIG. 6 is a main part perspective top view of an upper die of a mold die for explaining a state of the molding device in the molding process according to the embodiment.
Figure 7:
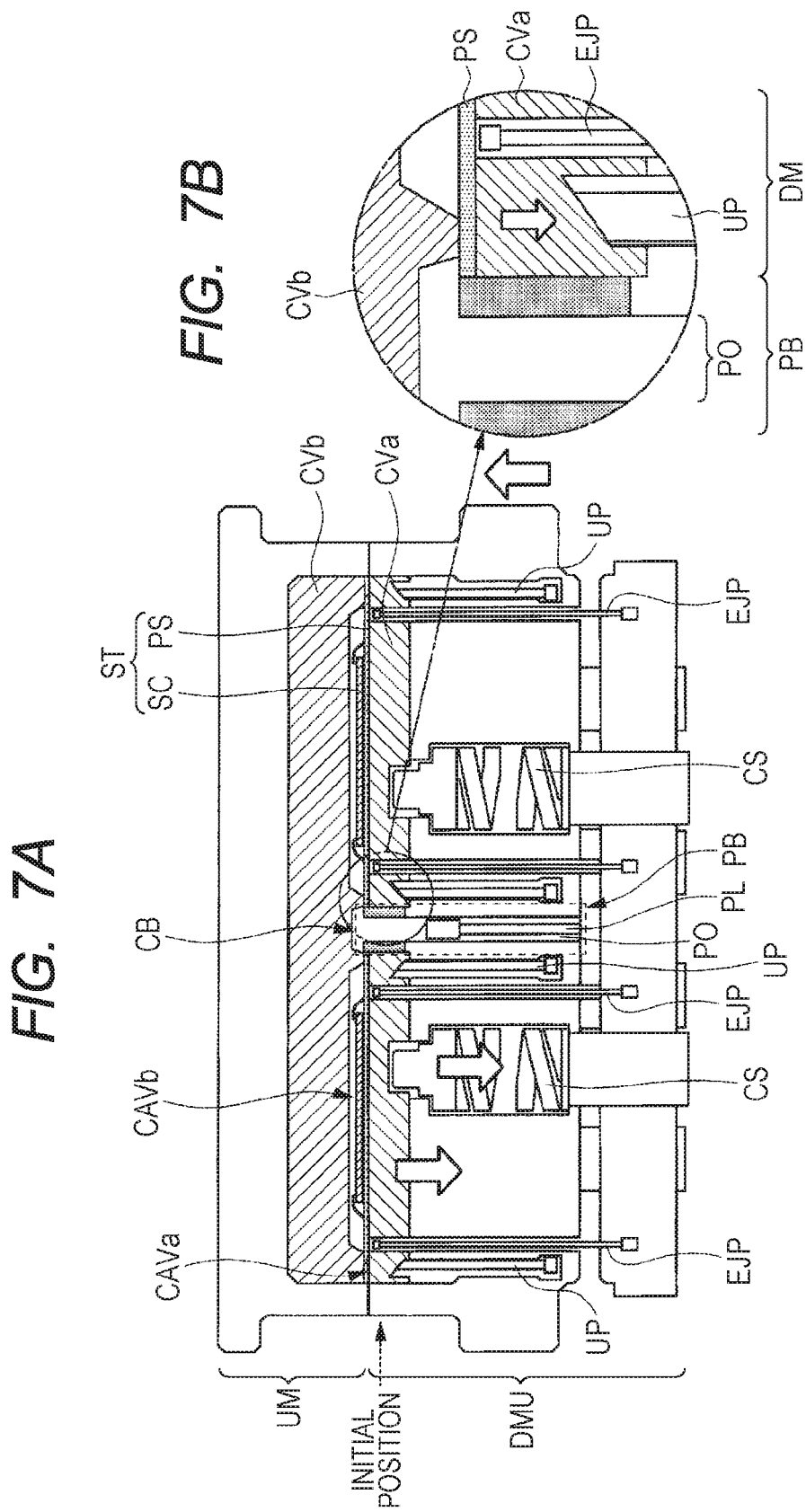
FIGS. 7A and 7B are a main part cross-sectional view for explaining a state of the molding device in the molding process and a main part cross-sectional view for showing the lower die unit of the molding device while enlarging a part thereof, respectively, continued from FIG. 5 and FIG. 6.
Figure 8:
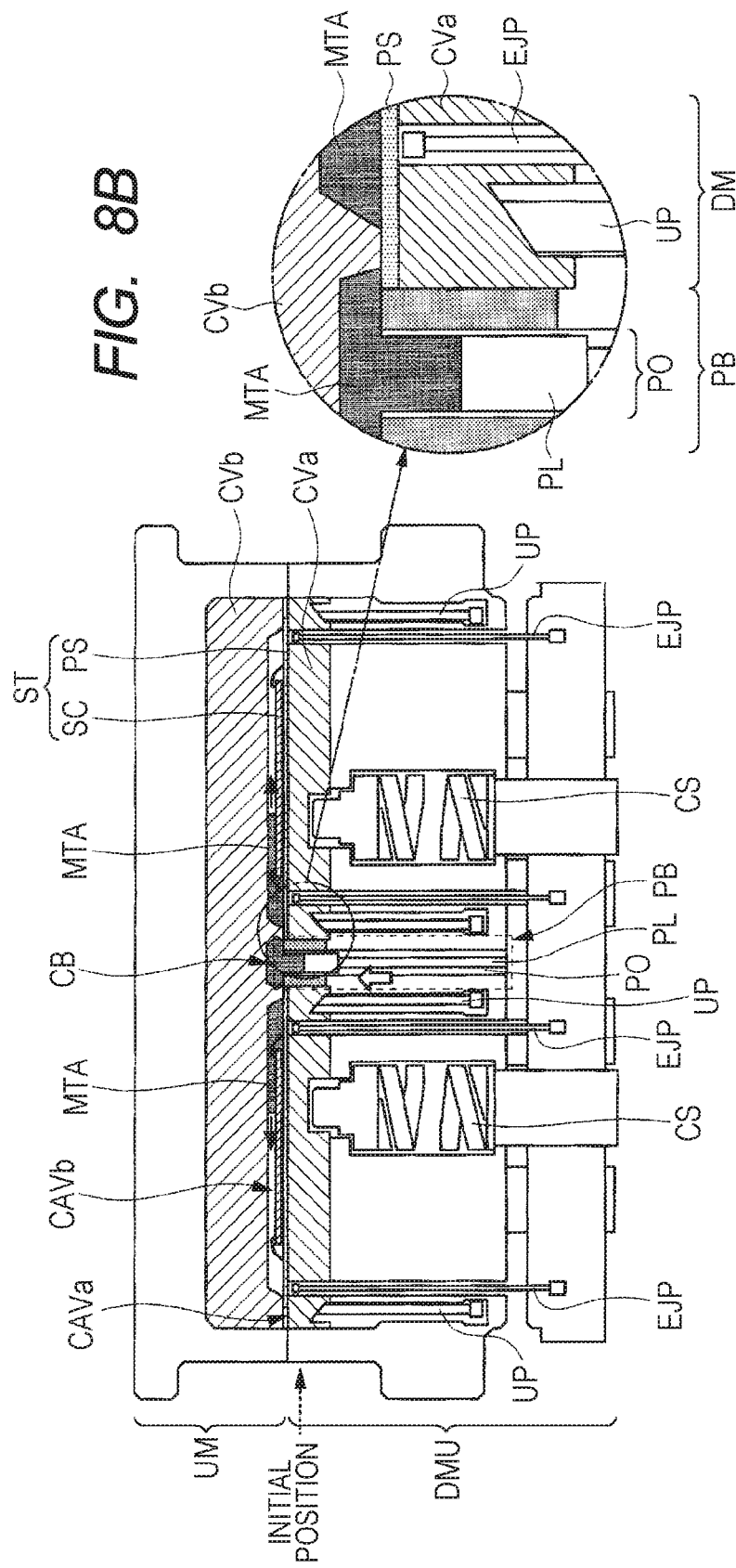
FIGS. 8A and 8B are a main part cross-sectional view for explaining a state of the molding device in the molding process and a main part cross-sectional view for showing the lower die unit of the molding device while enlarging a part thereof, respectively, continued from FIG. 7.
Figure 9:
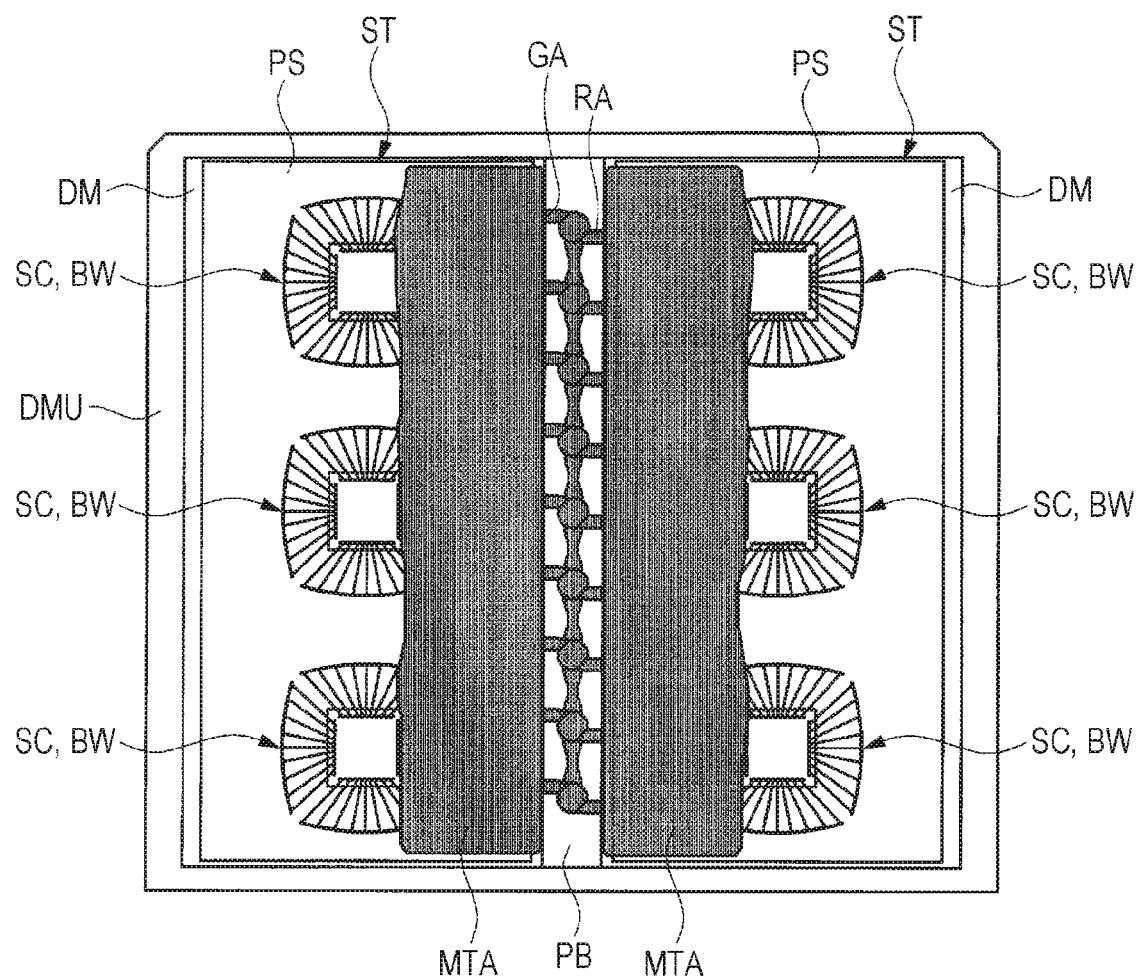
FIG. 9 is a main part perspective top view of the upper die of the mold die for explaining a state of the molding device in the molding process, continued from FIG. 7.
Figure 11:
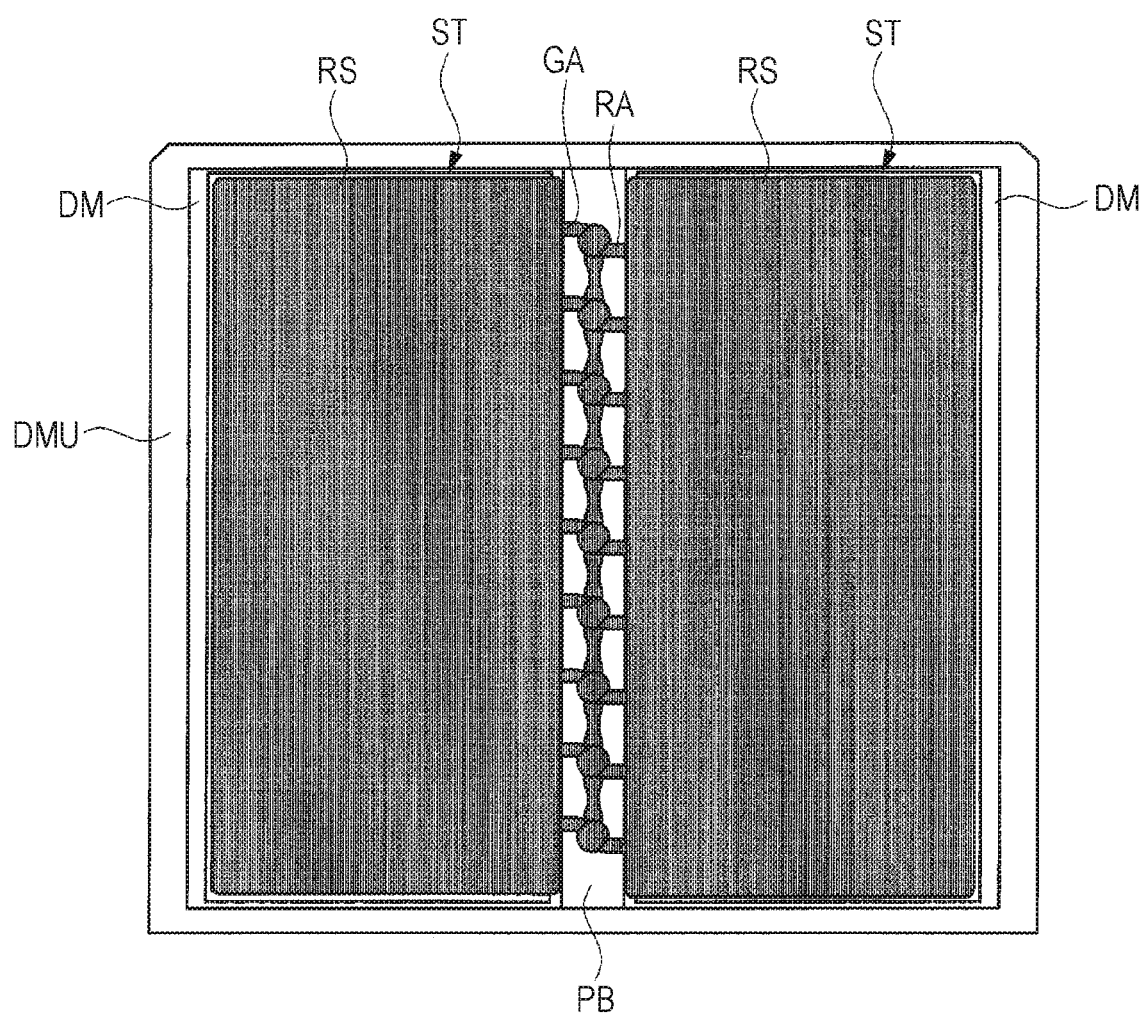
FIG. 11 is a main part perspective top view of the upper die of the mold die for explaining a state of the molding device in the molding process, continued from FIG. 8 and FIG. 9.
Figure 13:
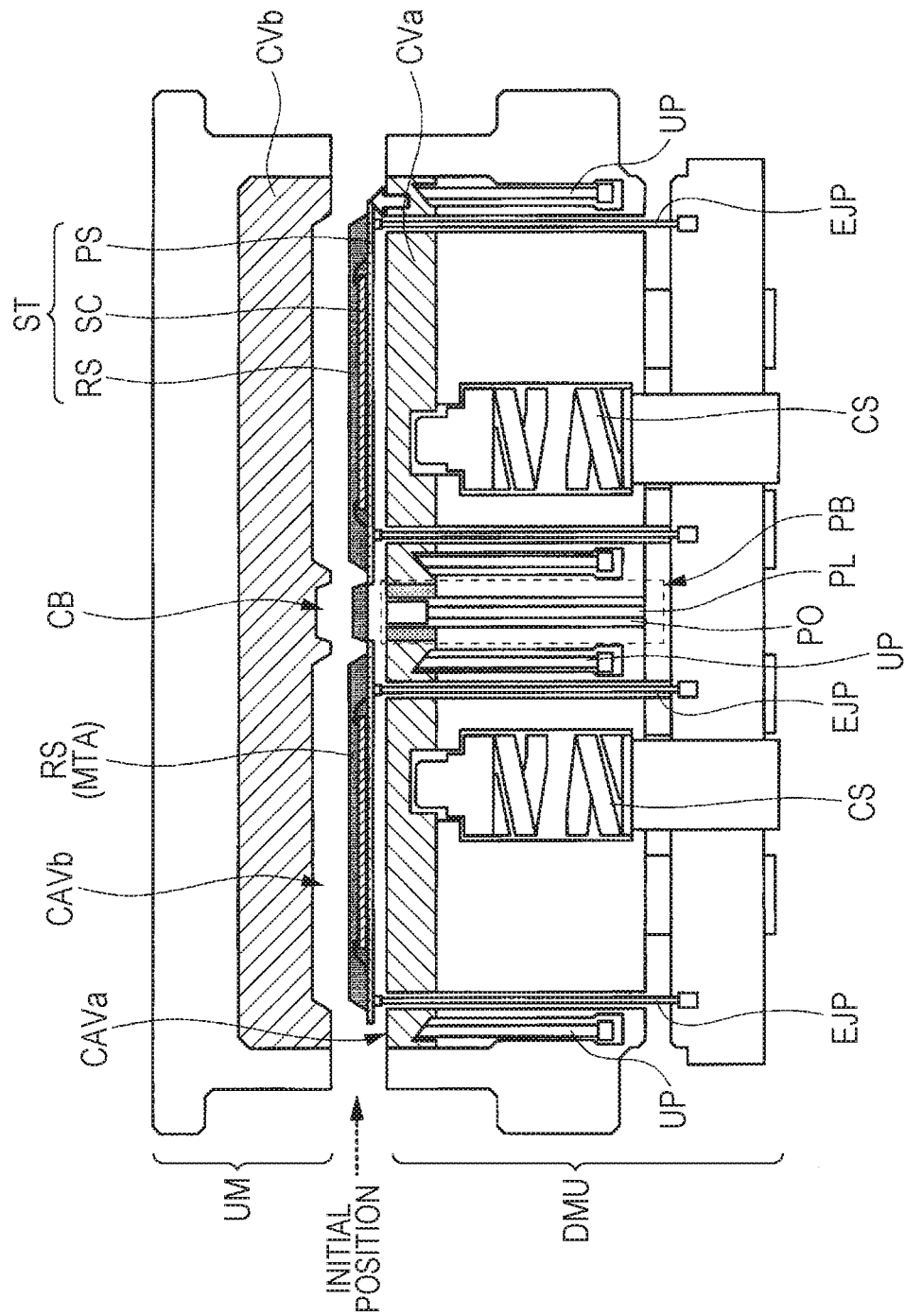
FIG. 13 is a main part cross-sectional view for explaining a state of the molding device in the molding process, continued from FIG. 12.

A manufacturing method (mainly, a molding process) of a semiconductor device according to the embodiment will be described using FIG. 4 to FIG. 13. FIG. 4 is a flowchart in the molding process of the manufacturing method of the semiconductor device. FIGS. 5A, 7A, 8A, 10A, and 12A are main part cross-sectional views each explaining a state of the molding device in the molding process, and FIGS. 5B, 7B, 8B, 10B, and 12B are main part cross-sectional views each showing the lower die unit of the molding device while enlarging a part thereof. Each of FIGS. 6, 9, and 11 is a main part perspective top view of the upper die of the mold die for explaining a state of the molding device in the molding process. FIG. 13 is a main part cross-sectional view for explaining a state of the molding device in the molding process.

The main characteristic of the embodiment is to improve the reliability and productivity of the semiconductor device by preventing the resin burr from being generated in the molding process, and the detail and effect thereof will become apparent in the following description.

[Preparation Process of Semiconductor Chip]

An integrated circuit is formed on a circuit formation surface of a semiconductor wafer. The integrated circuit is formed on the semiconductor wafer on a chip basis in accordance with a predetermined manufacturing process in a manufacturing step referred to as a pre-process or a diffusion process. Next, after the quality of each semiconductor chip formed on the semiconductor wafer is determined, the semiconductor wafer is diced to be separated into semiconductor chips.

[Preparation Process of Package Substrate]

A package substrate of a multi-layer wiring structure having an upper surface and a lower surface opposite to the upper surface is prepared. For example, the package substrate is configured in such a manner that three chip-mounted areas each corresponding to one semiconductor product are arranged in the longitudinal direction (see FIG. 6 to be described later).

[Die Bonding Process]

Next, the semiconductor chip is joined to each chip-mounted area of the upper surface (the principal surface or the top surface) of the package substrate through a die bond material (adhesive).

[Wire Bonding Process]

Next, for example, a plurality of electrode pads formed on the principal surface of the semiconductor chip and bonding electrodes arranged on the upper surface of the package substrate are electrically coupled to each other through conductive members (bonding wires) by a nail head bonding method in which ultrasonic vibrations are used together with thermocompression (see FIG. 6 to be described later). For example, gold wires of 15 to 20 μmφ are used for the bonding wires.

[Molding Process]

<<Step 1: Mounting of Substrate (Refer to the Following Description)>>

First, as shown in FIGS. 5A and 5B and FIG. 6, the package substrate PS (hereinafter, referred to as a substrate ST) on which the semiconductor chips SC as sealed members are mounted is positioned and placed on the surface of the lower die cavity block CVa. Next, a preheat treatment is performed for the substrate ST for about 20 seconds while the temperature of the lower die DM is set at, for example, about 175° C. The treatment is performed to ease the deformation of the substrate ST by heat. Next, the surfaces of the substrate ST and the lower die cavity CAVa are allowed to adhere to each other while the temperatures of the lower die DM and the upper die UM are set at, for example, about 175° C.

In this case, the lower die cavity block CVa is located at the initial position relative to the lower die unit DMU. Specifically, the surface of the lower die cavity block CVa and the upper surface of the pot block PB are in the same plane in the initial position. Further, the lower die cavity block CVa and the pot block PB are designed in such a manner that no gap is formed between the side surface of the lower die cavity block CVa and the side surface of the pot block PB in the initial position. Further, the substrate ST is placed on the surface of the lower die cavity block CVa in such a manner that the side surface of the lower die cavity block CVa and the side surface of the package substrate PS are in the same plane in the vertical direction (the thickness directions of the lower die cavity block CVa and the package substrate PS) in the initial position.

<<Step 2: Mold Clamping>>

Next, as shown in FIGS. 7A and 7B, the entire lower die unit DMU is moved (lifted) upward to a mold clamping position. Then, the upper surface of the outer circumference of the package substrate PS where no semiconductor chips SC are mounted and no conductive members BW are coupled in the substrate ST is allowed to be contacted with the upper die cavity block CVb of the upper die UM, and the mold clamping is performed for the upper die UM and the lower die DM. Accordingly, the package substrate PS is clamped and the substrate ST is fixed without a gap so that the mold resin is not leaked between the upper die UM and the lower die DM. In this case, the lower die cavity block CVa and the substrate ST are moved (lowered) downward to an appropriate position relative to the lower die unit DMU while keeping an appropriate pressure after a compression spring CS is compressed by the mold clamping force (the clamping force and the clamping pressure). The lower die cavity block CVa is moved downward by the thickness of the package substrate PS.

In this case, the lower die cavity block CVa is designed in such a manner that even in the case where the lower die cavity block CVa and the substrate ST are moved downward to an appropriate position relative to the lower die unit DMU, no gap is formed between the side surface of the pot block PB and the side surface of the lower die cavity block CVa.

Further, as described above, the substrate ST is placed on the surface of the lower die cavity block CVa in such a manner that the side surface of the lower die cavity block CVa and the side surface of the package substrate PS are in the same plane in the vertical direction in the initial position.

<<Step 3: Fixing of Lower Die Cavity>>

Next, the lower die cavity block CVa is fixed so that the lower die cavity block CVa is not moved (lowered) downward by the pressure when the mold resin is injected into the upper die cavity CAVb or the pressure applied to the mold resin injected into the upper die cavity CAVb.

Next, for example, a tablet that has been preliminarily heated and softened to some extent by a high-frequency heating machine is put into the pot PO. For example, a tablet obtained by solidifying epoxy resin or low molecular resin with a pressure is used.

<<Step 4: Sealing with Resin>>

Next, as shown in FIGS. 8A and 8B and FIG. 9, the plunger PL is lifted to press and melt the tablet, and the liquid mold resin MTA is pressurized and moved from the pot PO. Then, the mold resin MTA is injected into the upper die cavity CAVb from the cull block CB through the runner RA and the gate GA in a state where the lower die cavity block CVa is fixed.

Accordingly, as shown in FIGS. 10A and 10B and FIG. 11, an integral solid-shape resin sealing body RS in which the semiconductor chips SC and the conductive members BW mounted on the upper surface of the package substrate PS are sealed all together and the semiconductor chips are embedded on the upper surface side of the package substrate PS can be formed. Thereafter, the mold resin MTA is cured for, for example, about 90 seconds before being hardened.

In this case, the lower die cavity block CVa is designed in such a manner that no gap is formed between the side surface of the pot block PB and the side surface of the lower die cavity block CVa. Further, the substrate ST is placed on the surface of the lower die cavity block CVa in such a manner that no gap is formed between the side surface of the pot block PB and the side surface of the package substrate PS. Accordingly, no mold resin MTA enters between the side surface of the pot block PB and the side surface of the lower die cavity block CVa and between the side surface of the pot block PB and the side surface of the package substrate PS.

<<Step 5: Mold Opening and Operation of Returning Lower Die Cavity Block to Initial Position>>

Next, as shown in FIGS. 12A and 12B, when the mold resin MTA is hardened and the resin sealing body RS is formed after a predetermined period of time, the entire lower die unit DMU is lowered from the mold clamping position, and the upper die UM and the lower die unit DMU are opened.

Further, the lower die cavity block CVa is returned to the initial position. In the operation of returning the lower die cavity block CVa to the initial position, the lower die unit DMU is moved downward until the tip-end surface of the push-up pin UP is contacted with the rear surface of the lower die cavity block CVa and the lower die cavity block CVa is supported by the push-up pin UP.

In this case, the tip-end surface of each push-up pin UP and a part of the rear surface of the lower die cavity block CVa with which the tip-end surface of each push-up pin UP is contacted are inclined in such a manner that a distance to the surface of the lower die cavity CAVa on which the package substrate is mounted becomes longer towards the pot block PB side. Accordingly, the lower die cavity block CVa is lifted while being slightly moved towards the pot block PB side. Thus, no gap is formed between the side surface of the pot block PB and the side surface of the lower die cavity block CVa.

The lower die cavity block CVa is generally designed in such a manner that a small gap is formed in advance between the side surface of the pot block PB and the side surface of the lower die cavity block CVa in consideration of the sliding characteristics of the mold die and processing variation of the mold die. Therefore, for example, the lower die cavity block CVa is lowered at the time of the mold clamping (Step 2), and a gap is formed between the side surface of the pot block PB and the side surface of the lower die cavity block CVa in some cases.

Further, a gap is formed between the side surface of the pot block PB and the side surface of the package substrate PS in some cases due to variation caused when the substrate ST is placed on the surface of the lower die cavity block CVa or processing variation of the package substrate PS.

However, even if the mold resin MTA enters a gap formed between the side surface of the pot block PB and the side surface of the lower die cavity block CVa or a gap formed between the side surface of the pot block PB and the side surface of the package substrate PS, the mold resin MTA can be scraped out from the gap when the lower die cavity block CVa is returned to the initial position. Accordingly, the lower die cavity block CVa can be returned to the initial position by removing the mold resin MTA attached to the gap.

<<Step 6: Operation of Separating Substrate>>

Next, as shown in FIG. 13, the ejector pins EJP are lifted, and one end of each ejector pin EJP is allowed to protrude from the surface of the lower die cavity block CVa. Further, the ejector pins EJP are lifted, and the substrate (the package substrate PS obtained by sealing the semiconductor chips SC with resin) ST that is a sealed member attached to the lower die cavity block CVa is pushed upward, so that the substrate (the package substrate PS obtained by sealing the semiconductor chips SC with resin) ST is separated from the lower die cavity block CVa.

<<Step 7: Ejecting of Substrate>>

Next, the substrate ST separated from the lower die cavity block CVa is ejected from the mold die. Thereafter, the entire lower die unit DMU is lifted from the ejecting position of the substrate ST, and thus the mold die is returned to the initial state.

[Cutting Process]

Next, the integral resin sealing body RS in which the semiconductor chips SC are embedded on the upper surface side of the package substrate PS is ejected from the molding device, and is cut into individual semiconductor devices (BGA packages) in the cutting process. Thereafter, the finished semiconductor devices are sorted according to the product specification and inspected. Then, the semiconductor devices determined as not defective are shipped.

As described above, according to the embodiment, the tip-end surface of each push-up pin UP and a part of the rear surface of the lower die cavity block CVa with which the tip-end surface of each push-up pin UP is contacted are inclined in such a manner that a distance to the surface of the lower die cavity CVa on which the package substrate is mounted becomes longer towards the pot block PB side. Accordingly, when the lower die cavity block CVa is returned to the initial position after sealing with resin, the lower die cavity block CVa can be lifted while being slightly moved towards the pot block PB side. Thus, the lower die cavity block CVa can be returned to the initial position where the surface of the lower die cavity block CVa and the upper surface of the pot block PB are in the same plane without forming a gap between the side surface of the lower die cavity block CVa and the side surface of the pot block PB.

The lower die cavity block CVa can be returned to an appropriate position after sealing with resin, and thus it is possible to solve the problem that the resin burr is generated on the side surface of the package substrate PS. Further, even if the mold resin MTA enters a gap formed between the side surface of the lower die cavity block CVa and the side surface of the pot block PB and adheres to the side surface of the pot block PB, the mold resin MTA is scraped out from the gap when the lower die cavity block CVa is returned to the initial position. Thus, it is possible to solve the problem that the resin burr is generated on the side surface of the pot block PB.

Further, the scattering of the resin burr causing foreign substances does not occur. Thus, for example, the manufacturing of defective products due to the resin burr adhering to the joint parts of the solder balls SB of the semiconductor device SD can be reduced. Accordingly, the reliability and productivity of the semiconductor device can be improved.

MODIFIED EXAMPLE

Figure 14:
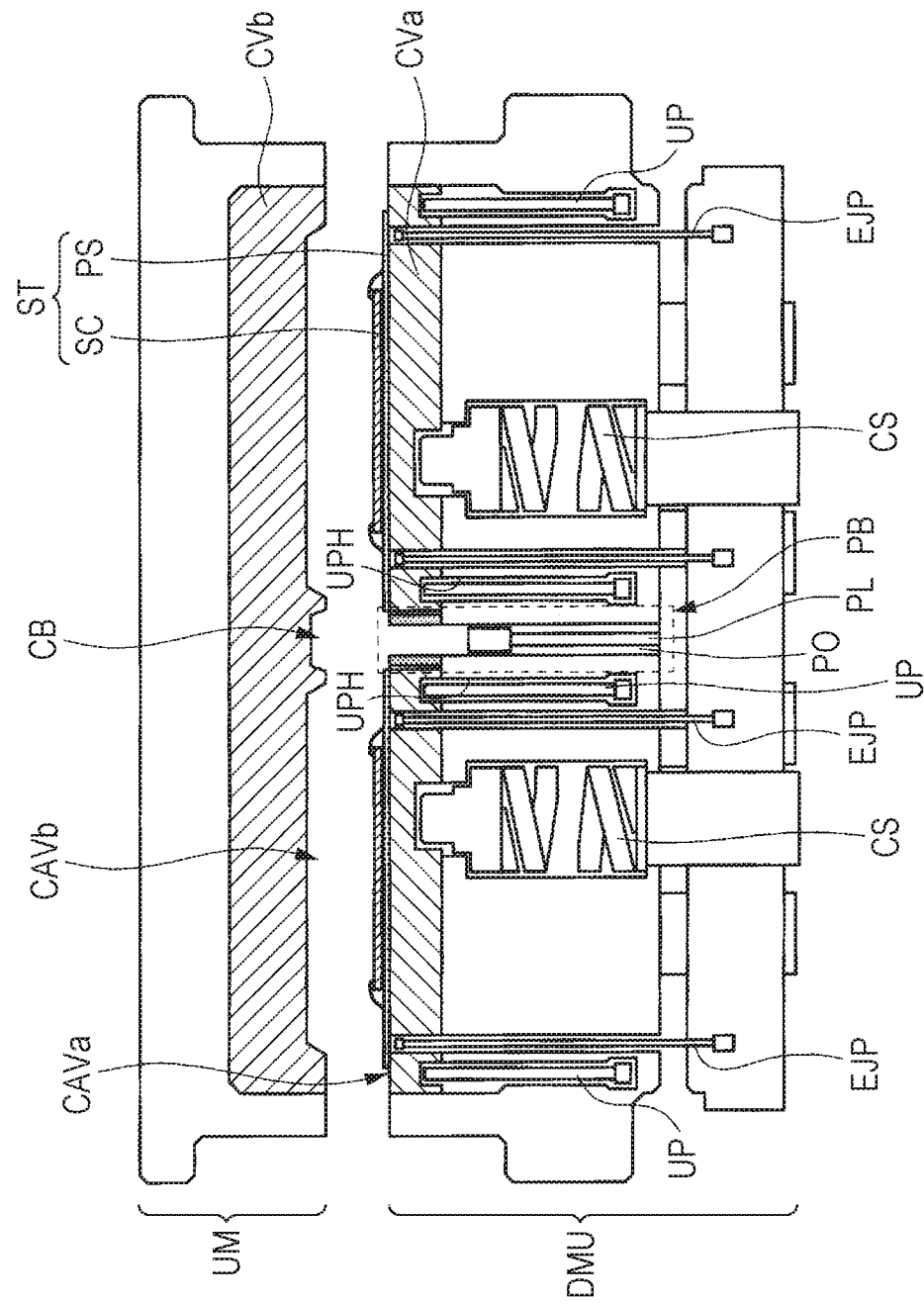
FIG. 14 is a main part cross-sectional view for showing a modified example of the molding device according to the embodiment.
Figure 15:
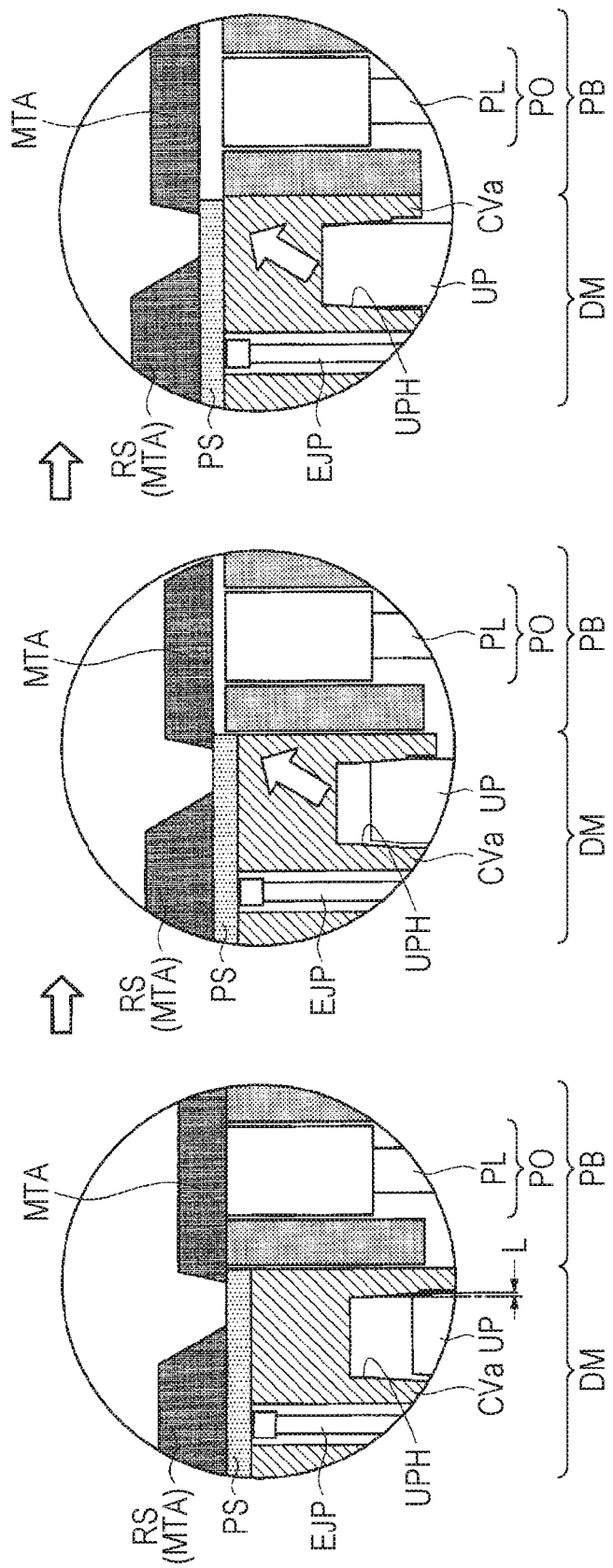
FIG. 15 is a main part cross-sectional view for explaining a state of the modified example of the molding device in the molding process according to the embodiment and for showing a lower die unit while enlarging a part thereof.

A modified example of the embodiment will be described using FIG. 14 and FIG. 15. FIG. 14 is a main part cross-sectional view for showing a modified example of a molding device. FIG. 15 is a main part cross-sectional view for explaining a state of the modified example of the molding device in a molding process and for showing a lower die unit while enlarging a part thereof.

A point different from the above-described embodiment will be described below.

Figure 2:
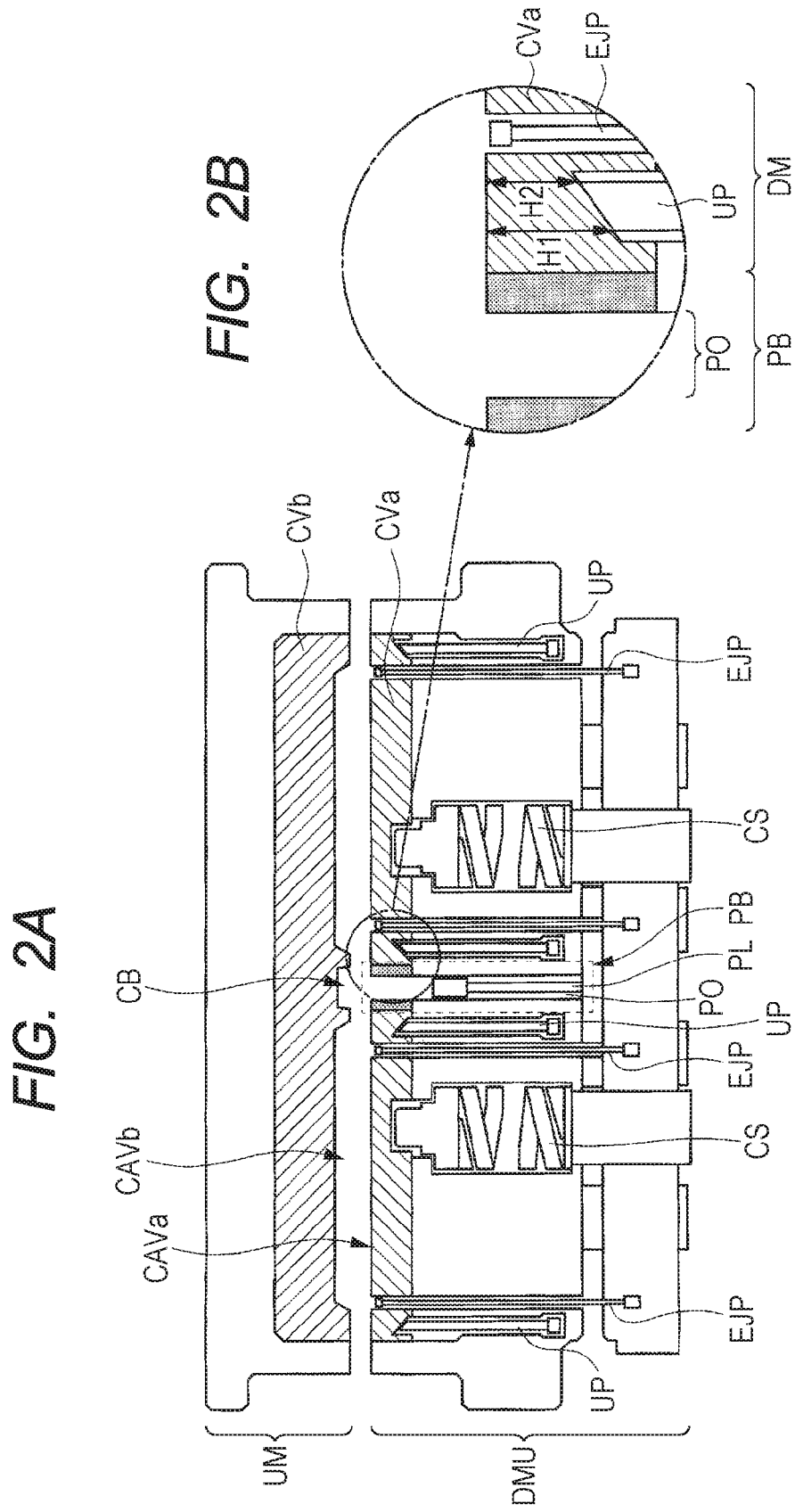
FIGS. 2A and 2B are a main part cross-sectional view for showing an example of a molding device according to the embodiment and a main part cross-sectional view for showing a lower die unit of the molding device while enlarging a part thereof, respectively.
Figure 3:
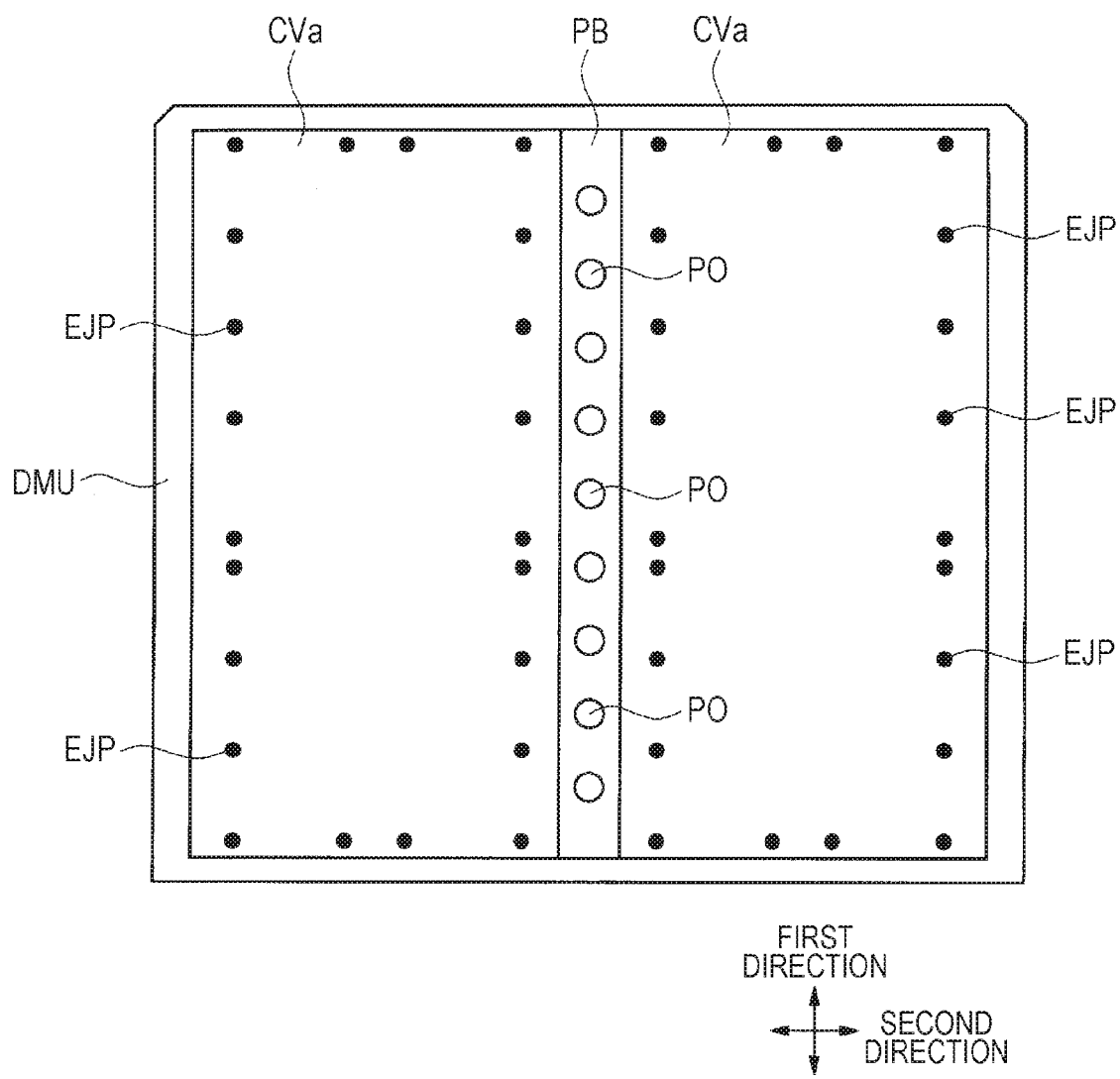
FIG. 3 is a main part top view for showing the lower die unit on which a lower die cavity block is mounted according to the embodiment.

As shown in FIG. 2, in the molding device according to the embodiment, the tip-end surface of each push-up pin UP and a part of the rear surface of the lower die cavity block CVa with which the tip-end surface of each push-up pin UP is contacted are inclined in such a manner that a distance to the surface of the lower die cavity block CVa on which the package substrate PS is mounted becomes longer towards the pot block PB side.

On the contrary, as shown in FIG. 14 and FIG. 15, in the molding device according to the modified example, the tip-end surface of each push-up pin UP and a part of the rear surface of the lower die cavity block CVa with which the tip-end surface of each push-up pin UP is contacted are formed to be substantially parallel to the surface of the lower die cavity block CVa on which the package substrate PS is mounted. In addition, a part of each side surface of a hole (hereinafter, referred to as a hole for push-up pin) UPH formed in the lower die cavity block CVa into which each push-up pin UP is inserted is inclined. The other structures are substantially the same as those of the molding device according to the embodiment. The hole for push-up pin UPH is formed on the rear surface side of the lower die cavity block CVa without penetrating the lower die cavity block CVa in the thickness direction.

Specifically, as shown in FIG. 15, when the resin sealing body RS is formed, the entire lower die unit DMU is lowered from the mold clamping position. Accordingly, the upper die UM and the lower die unit DMU are opened. Thereafter, the lower die cavity block CVa is returned to the initial position, and further the substrate (the package substrate PS obtained by sealing the semiconductor chips SC with resin) ST is separated from the lower die cavity block CVa using the ejector pins EJP.

In the operation of returning the lower die cavity block CVa to the initial position, the lower die unit DMU is moved downward until the tip-end surface of each push-up pin UP is contacted with each side surface of the hole for push-up pin UPH formed in the lower die cavity block CVa and the lower die cavity block CVa is supported by each push-up pin UP.

In this case, each side surface of the hole for push-up pin UPH has an inclined part so that the diameter of the hole for push-up pin UPH becomes smaller towards the upper side (the top surface side of the lower die cavity block CVa where the package substrate PS is mounted). When each push-up pin UP is moved upward in the hole for push-up pin UPH, the side surface of the push-up pin UP on the pot block PB side and the side surface of the hole for push-up pin UPH on the pot block PB side are contacted with each other, and the lower die cavity block CVa is moved (a dimension L shown in the left drawing of FIG. 15) in the direction of the pot block PB relative to the push-up pin UP. Accordingly, no gap is formed between the side surface of the pot block PB and the side surface of the lower die cavity block CVa.

Further, each side surface of the hole for push-up pin UPH is provided with the inclined part, and thus each push-up pin UP can advantageously enter the hole for push-up pin UPH with ease.

As described above, according to the modified example of the embodiment, the lower die cavity block CVa can be returned to the initial position as substantially similar to the above-described embodiment. Further, the resin burr is not generated and no scattering occurs. Thus, for example, the manufacturing of defective products due to the resin burr adhering to the joint parts of the solder balls of the semiconductor device can be reduced. Accordingly, the reliability and productivity of the semiconductor device can be improved.

The invention achieved by the inventors has been described above in detail on the basis of the embodiment. However, it is obvious that the present invention is not limited to the above-described embodiment, but can be variously changed without departing from the scope of the invention.

The embodiment has been described using the BGA package as an example, but the present invention is not limited to this. The principal characteristics of the present invention may be applied to a molding process of QFP (Quad Flat Package) in which a lead frame is used as a wiring member or a molding process of QFN (Quad Flat No lead package).

What is claimed is:

1. A manufacturing method of a semiconductor device comprising the steps of:
    (a) preparing a mold die including an upper die having an upper die cavity block, a lower die having a lower die cavity block and push-up pins, and a pot block having a pot that supplies resin;
    (b) preparing a semiconductor chip mounted over an upper surface of a substrate;
    (c) arranging the substrate over a surface of the lower die cavity block;
    (d) clamping the substrate between the upper die and the lower die so that the semiconductor chip is located in an upper die cavity of the upper die cavity block;
    (e) supplying the resin into the upper die cavity from the pot of the pot block to seal the semiconductor chip with resin; and
    (f) pressing the push-up pins against the rear surface opposite to the surface of the lower die cavity block to return the lower die cavity block sunk in the step (d) to the initial position,
    wherein a tip-end surface of each push-up pin and a part of the rear surface of the lower die cavity block with which the tip-end surface of each push-up pin is contacted are inclined in such a manner that a distance to the surface of the lower die cavity block becomes longer towards the pot side.

2. The manufacturing method of a semiconductor device according to claim 1,
    wherein the tip-end surface of each push-up pin is mirror-finished.

3. The manufacturing method of a semiconductor device according to claim 2,
    wherein the roughness of the tip-end surface of each push-up pin is 3 μm or smaller in ten-point average roughness.

4. The manufacturing method of a semiconductor device according to claim 1,
    wherein plating is applied to the tip-end surface of each push-up pin.

5. The manufacturing method of a semiconductor device according to claim 4,
    wherein hard chromium plating is applied to the tip-end surface of each push-up pin.

6. The manufacturing method of a semiconductor device according to claim 1,
    wherein the two or more push-up pins are pressed against the rear surface of the lower die cavity block.

7. The manufacturing method of a semiconductor device according to claim 1, wherein the surface of the lower die cavity block and the upper surface of the pot block are in the same plane in the initial position of the lower die cavity block.

* * * * *